US009782772B2

(12) United States Patent
Shim et al.

(10) Patent No.: US 9,782,772 B2
(45) Date of Patent: Oct. 10, 2017

(54) METHOD OF BONDING TWO SURFACES AND CONSTRUCT THEREFROM AND MICROFLUIDIC DEVICE CONTAINING THE CONSTRUCT

(71) Applicant: Samsung Electronics Co., Ltd., Suwon-si, Gyeonggi-do (KR)

(72) Inventors: Jeoyoung Shim, Yongin-si (KR); Woosung Jeon, Suwon-si (KR); Yongkoo Kyoung, Seoul (KR); Euiseong Moon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 101 days.

(21) Appl. No.: 14/930,412

(22) Filed: Nov. 2, 2015

(65) Prior Publication Data

US 2016/0121327 A1 May 5, 2016

(30) Foreign Application Priority Data

Oct. 31, 2014 (KR) ........................ 10-2014-0150623

(51) Int. Cl.
  *B32B 3/26* (2006.01)
  *B32B 7/04* (2006.01)
  *B01L 3/00* (2006.01)
  *B29C 65/02* (2006.01)
  *B29C 65/00* (2006.01)
  (Continued)

(52) U.S. Cl.
  CPC ........ *B01L 3/502707* (2013.01); *B29C 65/02* (2013.01); *B29C 66/026* (2013.01); *B29C 66/028* (2013.01); *B29C 66/112* (2013.01); *B29C 66/114* (2013.01); *B29C 66/1122* (2013.01); *B29C 66/5412* (2013.01); *B29C 66/71* (2013.01); *B81C 3/001* (2013.01); *B01L 2200/0689* (2013.01); *B01L 2300/0887* (2013.01); *B01L 2300/12* (2013.01); *B29L 2031/7506* (2013.01); *B29L 2031/756* (2013.01)

(58) Field of Classification Search
  CPC .......... B32B 38/0008; B32B 3/26; B32B 7/04
  USPC ............ 422/502, 503, 504; 156/272.2, 273.3
  See application file for complete search history.

(56) References Cited

U.S. PATENT DOCUMENTS

| 5,234,809 A | 8/1993 | Boom et al. |
| 5,776,563 A | 7/1998 | Buhl et al. |
| 5,804,375 A | 9/1998 | Gelfand et al. |

(Continued)

FOREIGN PATENT DOCUMENTS

| CN | 102701145 A | 10/2012 |
| JP | 2005-199394 A | 7/2005 |

(Continued)

OTHER PUBLICATIONS

Cho et al., Clinical evaluation of micro-scale chip-based PCR system for rapid detection of hepatitis B virus, *Biosensors & Bioelectronics*, 21: 2161-2169 (2006).

(Continued)

*Primary Examiner* — Brian J Sines
(74) *Attorney, Agent, or Firm* — Leydig, Voit & Mayer, Ltd.

(57) ABSTRACT

Provided is a method of bonding two surfaces, which includes providing nitrogen or ammonia plasma to a plastic material where a polysiloxane contacted, and a construct manufactured therefrom.

17 Claims, 5 Drawing Sheets

(51) Int. Cl.
*B81C 3/00* (2006.01)
*B29L 31/00* (2006.01)

(56) References Cited

U.S. PATENT DOCUMENTS

| | | | |
|---|---|---|---|
| 5,958,349 | A | 9/1999 | Petersen et al. |
| 6,156,507 | A | 12/2000 | Hiramatsu et al. |
| 6,303,305 | B1 | 10/2001 | Wittwer et al. |
| 6,358,679 | B1 | 3/2002 | Heid et al. |
| 6,369,893 | B1 | 4/2002 | Christel et al. |
| 6,431,476 | B1 | 8/2002 | Taylor et al. |
| 6,432,290 | B1 | 8/2002 | Harrison et al. |
| 6,503,720 | B2 | 1/2003 | Wittwer et al. |
| 6,691,041 | B2 | 2/2004 | Sagner et al. |
| 6,814,934 | B1 | 11/2004 | Higuchi |
| 6,887,693 | B2 | 5/2005 | McMillan et al. |
| 6,914,137 | B2 | 7/2005 | Baker |
| 7,312,611 | B1 | 12/2007 | Harrison et al. |
| 7,439,023 | B2 | 10/2008 | Hwang et al. |
| 7,445,926 | B2 | 11/2008 | Mathies et al. |
| 7,838,300 | B2 | 11/2010 | Namkoong et al. |
| 7,923,551 | B2 | 4/2011 | Lee et al. |
| 8,185,324 | B2 | 5/2012 | Namkoong et al. |
| 8,318,586 | B2 | 11/2012 | Libralesso et al. |
| 8,475,671 | B2 * | 7/2013 | Jalabert ............. 216/41 |
| 8,580,506 | B2 | 11/2013 | Jung et al. |
| 8,584,703 | B2 | 11/2013 | Kobrin et al. |
| 8,859,272 | B2 | 10/2014 | Hwang et al. |
| 2008/0044884 | A1 | 2/2008 | Hwang et al. |
| 2010/0101719 | A1* | 4/2010 | Otsuka et al. ........... 156/272.6 |
| 2011/0129986 | A1* | 6/2011 | Libralesso et al. ........ 438/455 |
| 2011/0195260 | A1* | 8/2011 | Lee et al. .............. 428/447 |
| 2011/0286885 | A1 | 11/2011 | Park et al. |
| 2011/0286895 | A1 | 11/2011 | Park et al. |
| 2012/0244428 | A1 | 9/2012 | Park et al. |
| 2013/0264205 | A1 | 10/2013 | Hwang et al. |
| 2013/0306160 | A1 | 11/2013 | Chung et al. |
| 2013/0330720 | A1 | 12/2013 | Jung et al. |
| 2013/0337234 | A1* | 12/2013 | Shim et al. ............ 428/172 |
| 2014/0154688 | A1 | 6/2014 | Jung et al. |

FOREIGN PATENT DOCUMENTS

| | | |
|---|---|---|
| JP | 2011-523784 A | 8/2011 |
| KR | 2008-0074252 A | 8/2008 |
| KR | 2010-0087849 A | 8/2010 |
| KR | 2012-0101095 A | 9/2012 |
| KR | 2012-0109080 A | 10/2012 |
| KR | 2013-0141985 A | 12/2013 |
| KR | 2014-0042968 A | 4/2014 |
| KR | 2014-0047923 A | 4/2014 |
| WO | WO 2008/088068 A1 | 7/2008 |

OTHER PUBLICATIONS

Dang et al., Replica multichannel polymer chips with a network of sacrificial channels sealed by adhesive printing method, *Lab Chip*, 5: 472-478 (2005).

Griebel et al., Integrated polymer chip for two-dimensional capillary gel electrophoresis, *Lab Chip*, 4: 18-23 (2004).

Hromada et al., Single molecule measurements within individual membrane-bound ion channels using a polymer-based bilayer lipid membrane chip, *Lab Chip*,8: 602-608 (2008).

Hwang et al., Solid Phase DNA Extraction with a Flexible Bead-Packed Microfluidic Device to Detect Methicillin-Resistant *Staphylococcus aureus* in Nasal Swabs, *Analytical Chemistry*, 84: 7912-7918 (2012).

Hwang et al., Miniaturized bead-beating device to automate full DNA sample preparation processes for Gram-positive bacteria, *Lab Chip*, 11: 3649-3655 (2011).

Hwang et al., Bacterial DNA Sample Preparation from Whole Blood Using Surface-Modified Si Pillar Arrays, *Analytical Chemistry*, 80: 7786-7791 (2008).

Lee et al., Plastic-PDMS bonding for high pressure hydrolytically stable active microfluidics, *Lab Chip*, 9: 1618-1624 (2009).

Lu et al., Packaging of microfluidic chips via interstitial bonding technique, *Electrophoresis*,29: 1407-1414 (2008).

McDonald et al., Poly(dimethylsiloxane) as a Material for Fabricating Microfluidic Devices, *Accounts of Chemical Research*, 35(7): 491-499 (2002).

Tang et al., A facile route for irreversible bonding of plastic-PDMS hybrid microdevices at room temperature, *Lab Chip*, 10:1274-1280 (2010).

Tsao et al., Bonding of thermoplastic polymer microfluidics, *Microfluid Nanofluid*, 6: 1-16 (2009).

* cited by examiner

METHOD OF BONDING TWO SURFACES AND CONSTRUCT THEREFROM AND MICROFLUIDIC DEVICE CONTAINING THE CONSTRUCT

RELATED APPLICATION

This application claims the benefit of Korean Patent Application No. 10-2014-0150623, filed on Oct. 31, 2014, in the Korean Intellectual Property Office, the entire disclosure of which is hereby incorporated by reference.

BACKGROUND

1. Field

The present disclosure relates to a method of bonding two surfaces and construct therefrom and a microfluidic device containing the construct.

2. Description of the Related Art

Microfluidic devices are used for various purposes. For example, a microfluidic device can be used as an analysis device with high throughput. A microfluidic device may include a microstructure such as a channel and a chamber. Such a microfluidic device may be manufactured by using various methods, such as lithography, etching, depositing, micromachining, lithographic, galvanoforming, abforming (LIGA) technology, or the like.

A microfluidic device may be manufactured by forming a microstructure such as a channel in different substrates and then bonding the substrates. For example, a microstructure can be formed in two glass substrates, and then, the two glass substrates are bonded together to form a microfluidic device. Each of the two glass substrates may include all or part of a microstructure.

Plastic is easier to handle and cheaper than glass materials when manufacturing a product including a microstructure. However, there remains a need for new methods of efficiently bonding plastic materials to other materials used in microfluidic devices, particularly elastomers such as polydimethylsiloxane (PDMS).

SUMMARY

Provided is a method of efficiently bonding two surfaces. A method of bonding two surfaces, the method comprising: contacting a surface of a plastic material with a polysiloxane material; removing the polysiloxane material from the surface of the plastic material; providing nitrogen or ammonia plasma to the surface of the plastic material that was contacted with the polysiloxane material; providing oxygen plasma to a surface of a polysiloxane material; and contacting the surface of the plastic material provided with nitrogen or ammonia plasma with the surface of the polysiloxane material provided with oxygen plasma to bond the surfaces together and provide a bonded product.

Also provided is a construct manufactured according to the method, as well as a microfluidic device including the construct.

Additional aspects will be set forth in part in the description which follows and, in part, will be apparent from the description, or may be learned by practice of the presented exemplary embodiments.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

According to an aspect of an exemplary embodiment, a method of bonding two surfaces, the method comprising: contacting a surface of a plastic material with a polysiloxane material; removing the polysiloxane material from the surface of the plastic material; providing nitrogen or ammonia plasma to the surface of the plastic material that was contacted with the polysiloxane contacted; providing oxygen plasma to a surface of a polysiloxane material; and contacting the surface of the plastic material provided with nitrogen or ammonia plasma with the surface of the polysiloxane material provided with oxygen plasma to bond the surfaces together and provide a bonded product, wherein the bonded product is a microfluidic device.

The method includes contacting a surface of a plastic material with a first polysiloxane material. The polysiloxane may be identical to or different from polysiloxane having a surface that is provided with oxygen plasma and bound to the surface of the plastic material treated with nitrogen or ammonia plasma.

In the contacting a surface of a plastic material with a first polysiloxane material, the contacting may be performed in an atmosphere or in a dry state, not in water. The contacting may include applying pressure between the surface and the polysiloxane. The pressure may be appropriate pressure in which at least some of the polysiloxane may be attached to and remain on the first surface. A range of the pressure may be appropriately selected by one of ordinary skill in the art depending on the type and thickness of a plastic material having a first surface and the thickness, temperature, or the like of the polysiloxane. The pressure may be 100 Pa or less, for example, 1 to 100 Pa, 5 to 100 Pa, 10 to 100 Pa, 20 to 100 Pa, 30 to 100 Pa, 40 to 100 Pa, 50 to 100 Pa, 60 to 100 Pa, 70 to 100 Pa, 80 to 100 Pa, 90 to 100 Pa, 1 to 90 Pa, 5 to 80 Pa, 10 to 70 Pa, 20 to 60 Pa, 30 to 50 Pa, 1 to 50 Pa, 1 to 30 Pa, 5 to 50 Pa, 5 to 30 Pa, 5 to 20 Pa, or 10 to 20 Pa. The pressure may also be at least 1 Pa. The contacting may be performed at any suitable temperature, such as a temperature of about 95° C. to about 150° C., about 95° C. to about 130° C., about 95° C. to about 120° C., about 95° C. to about 110° C., about 95° C. to about 100° C.

The method includes removing the polysiloxane material from the surface of the plastic material. In this case, some moieties attached to a contacted surface of the polysiloxane may be detached from the contacted surface of the polysiloxane and then attached to the surface of the plastic material due to an adhesion strength with the surface. Accordingly, the surface of the plastic material may include oxygen, carbon, silicon, and/or hydrogen atoms derived from the polysiloxane (e.g., increased oxygen, carbon, silicon, and/or hydrogen as compared to the surface of the plastic material without contact with the polysiloxane material). The surface of the plastic material contacted with the polysiloxane may be all or some portion of a certain side of the plastic material. For example, when the plastic material has a flat lower surface, and all or part of a microstructure, for example, a channel, a chamber, a valve, or the like are formed in some parts of the flat lower surface, some parts of a surface, where the microstructure is formed, may not contact the polysiloxane, for example, forming a recess in the surface.

In the contacting a surface of a plastic material with a first polysiloxane, the polysiloxane may include a polymer structure having a repeating silicon-oxygen group in a backbone, a side chain, or cross-links, regardless of whether or not a silicon atom is substituted. The polysiloxane may be represented by Formula 1 below:

(Formula 1)

$R_1$, $R_2$, and $R_3$ in Formula 1 may be each independently selected from a hydrogen and a group consisting of an alkyl group, an aryl group, a cycloalkyl group, an alkoxy group, a hydroxyalkyl, an alkoxyalkyl group, and a hydroxyalkoxyalkyl group, each optionally substituted with a halo group; $R_4$ is selected from a group consisting of a hydrogen, and an alkyl group or an aryl group, each optionally substituted with a halo group; n may be an integer of, for example, 1 to 50,000, 1 to 40,000, 1 to 30,000, 1 to 20,000, 1 to 10,000, 1 to 5,000, 1 to 3,000, 1 to 2,000, 2 to 50,000, 2 to 40,000, 2 to 30,000, 2 to 20,000, 2 to 10,000, 2 to 5,000, 2 to 3,000, 2 to 2,000, 5 to 50,000, 10 to 50,000, 50 to 50,000, 100 to 50,000, or 1,000 to 50,000. $R_1$, $R_2$, $R_3$, and $R_4$ may each independently have 1 to 30 carbon atoms, for example, 1 to 20, 1 to 15, 1 to 10, or 1 to 6 carbon atoms. In some embodiments, $R_1$, $R_2$, $R_3$, and $R_4$ may each independently be an alkyl group or an aryl group having 1 to 30 carbon atoms, for example, 1 to 20, 1 to 15, 1 to 10, or 1 to 6 carbon atoms. The alkyl group may be a methyl group, an ethyl group, a propyl group, a butyl group, a pentyl group, a hexyl group, a heptyl group, a nonyl group, or a decanyl group. The aryl group may be a phenyl group.

The polysiloxane may be a material including polysiloxane as well as a completely polysiloxane material. For example, the polysiloxane includes a plastic material that includes polysiloxane and thus exposes the polysiloxane on a surface of the plastic material. The plastic material including polysiloxane may be a flexible material or an elastomer. The polysiloxane may be polydimethylsiloxane (PDMS) or polyphenylsiloxane.

The polysiloxane may be formed in a shape of a film. The film may have a thickness, for example, of 10 μm to 500 μm, or 100 μm to 300 μm.

The polysiloxane may be a solid. The contacting a surface of a plastic material with a first polysiloxane may include contacting a surface of a plastic material with the polysiloxane in a solid state in a atmosphere or in a dry state.

The plastic material may be a carbon-based polymer. The plastic material may be polyolefin, polystyrene, polycarbonate (PC), polymethacrylate (PMA), poly(methyl methacrylate) (PMMA), polytetrafluoroethylene (PTFE), polyvinylidene chloride (PVC), polyethylene terephthalate (PET), or a combination thereof. The polyolefin is a polymer produced from simple olefin (also referred to as "alkene") as a monomer. The polyolefin may include polyethylene (PE), polypropylene (PP), polymethylpentene (PMP), poly(1-butene) (PB-1), polyisobutylene (PIB), ethylene-propylene rubber (EPR), ethylene propylene diene monomer (M-class) rubber (EPDM rubber), or a combination thereof. The plastic material may have a hydrophobic or hydrophilic surface.

A microstructure may be formed in the whole or part of the first surface. The microstructure may not necessarily be formed in a micrometer dimension, and may be formed in a small dimension. For example, at least one cross-sectional surface of the microstructure, i.e. a diameter, a width, a height, or the like, may be in a range of about 1 nm to about 1,000 mm, about 10 nm to about 100 mm, or about 10 nm to about 10 mm. The microstructure may provide a path for fluid flow. For example, the microstructure may be selected from a group consisting of a channel, a chamber, an inlet, and an outlet. The microstructure may be formed in a surface, an inner portion, or some parts of the surface and the inner portion, of the plastic material. The microstructure of the first surface may be formed by using a method selected from a group consisting of known methods for forming a microstructure in a plastic material, for example, injection molding, photolithography, and a lithographic, galvanoforming, abforming (LIGA) method.

The method may include providing nitrogen or ammonia plasma to the surface of the plastic material that was contacted with the polysiloxane. Providing nitrogen or ammonia plasma may be performed by exposing the first surface to nitrogen or ammonia plasma. The exposing may be performed in sealed vessel such as a sealed vessel in a plasma generator. The term "sealed vessel" refers to a vessel that was closed during the exposure to the plasma. Exposure of plasma may be performed at a power of about 30 W to about 50 W, at a N2 or ammonia flow rate of about 1 standard cubic centimeter per minutes (sccm) to about 5 sccm, and for about 20 seconds to about 60 seconds.

Applying the plasma may involve applying an electromagnetic field to nitrogen and/or ammonia molecules to generate plasma and then contacting a surface of the plastic material with the plasma. The plasma may be generated at a temperature of 100° C. or less, for example, at room temperature or a temperature of about 25° C. to about 100° C.

The method may include providing oxygen plasma to a surface of a polysiloxane material to be bonded to the plastic surface. The providing may include exposing the second surface to oxygen plasma. Exposing the second surface to the plastic material may be performed in sealed vessel such a sealed vessel in a plasma generator. Exposure to the oxygen plasma may be performed at power of about 70 W to about 100 W, at an oxygen flow rate of about 30 sccm to about 50 sccm, and for about 60 seconds to about 180 seconds.

Applying the plasma may involve applying an electromagnetic field to oxygen molecules to generate plasma for contacting. The plasma may be generated at a temperature of 100° C. or less, for example, at room temperature or a temperature of about 25° C. to about 100° C.

The method includes contacting the surface of the plastic material provided with nitrogen or ammonia plasma with the surface of the polysiloxane material provided with oxygen plasma to bond the surfaces together and provide a bonded product. The contacting may include applying pressure between the surfaces. The pressure may be 1 kPa or less, for example, 1 to 1000 Pa, 10 Pa to 1000 Pa, 50 Pa to 1000 Pa, 100 Pa to 1000 Pa, 200 Pa to 1000 Pa, 500 Pa to 1000 Pa, 700 Pa to 1000 Pa, 800 Pa to 1000 Pa, 1 Pa to 900 Pa, 10 Pa to 800 Pa, 50 Pa to 600 Pa, 50 Pa to 500 Pa, 50 Pa to 100 Pa, 100 Pa to 800 Pa, or 100 Pa to 500 Pa. The pressure may also be at least 1 Pa. The contacting may be performed at a temperature of 100° C. or less, for example, in a range of about 10° C. to about 100° C., about 20° C. to about 100° C., about 30° C. to about 100° C., about 50° C. to about 100° C., about 10° C. to about 70° C., about 10° C. to about 50° C., about 10° C. to about 30° C., about 10° C. to about 25° C., or about 1° C. to about 50° C.

Also, after the contacting, annealing may be included. The annealing may be performed at a glass transition temperature (Tg) of a plastic material or less. In the annealing, a product produced by bonding above may be treated at a temperature of about 25° C. to about 100° C. The annealing may be performed for about 2 hours to 10 hours, for example, for 2 hours to 5 hours.

The method may further include providing oxygen plasma to a second surface of the polysiloxane opposite to the first surface provided with oxygen plasma; contacting a surface of a second plastic material with a polysiloxane; providing nitrogen or ammonia plasma to the surface of the second plastic material where the polysiloxane was contacted; and bonding the surface of the second plastic material contacted with the polysiloxane and nitrogen or ammonia plasma provided to the second surface of the polysiloxane opposite to the first surface by contacting the surface of the second plastic material (previously contacted with polysiloxane and nitrogen or ammonia plasma) with the second surface of the polysiloxane opposite to the first surface of the polysiloxane material.

Thus, for instance, the method can comprise applying oxygen plasma to two opposing surfaces of a polysiloxane film, contacting one surface to the plastic material treated with nitrogen or ammonia plasma so as form a bond, and contacting the other surface of the polysiloxane film to another polysiloxane substrate to form another bond, resulting in a bonded structure comprising the polysiloxane film between the plastic material and the polysiloxane substrate.

Alternatively, the method can comprise applying oxygen plasma to on surfaces of a polysiloxane film, which is contacted the oxygen plasma-treated surface to the plastic material treated with nitrogen or ammonia plasma so as form a bond, treating the surface of another polysiloxane substrate with oxygen plasma, and contacting the oxygen plasma-treated surface of the polysiloxane substrate with the untreated surface of the polysiloxane film. Again, the method results in a bonded structure comprising the polysiloxane film between the plastic material and the polysiloxane substrate.

As another example, the method can comprise treating both sides of the polysiloxane film and a surface of another polysiloxane substrate with oxygen plasma before bonding. Thus, the method can comprise applying oxygen plasma to two opposing surfaces of a polysiloxane film, contacting one surface to the plastic material treated with nitrogen or ammonia plasma so as form a bond, and contacting the opposite surface of the polysiloxane film to another polysiloxane substrate that has been treated with oxygen plasma to form another bond. As in the other examples, this method results in a bonded structure comprising the polysiloxane film between the plastic material and the polysiloxane substrate.

A microstructure may be formed in the whole or part of the third surface. The microstructure does not necessarily refer to a structure in a micro dimension, but a structure in a small dimension. For example, the microstructure may include at least one cross-section having a diameter, a width, a height, or the like of about 10 nm to about 100 mm, or about 10 nm to about 10 mm. The microstructure may provide a path for fluid flow. For example, the microstructure may be selected from a group consisting of a channel, a chamber, an entrance, and an exit. The microstructure may be formed in a part of an outer surface, an inner portion, or the outer surface and the inner portion of a substrate. A microstructure of the third surface may be formed by using a known method for forming a microstructure in a plastic material, for example, a method selected from a group consisting of injection molding, photolithography, and an LIGA method. The microstructure may be a pneumatic layer including a pneumatic chamber that extends an elastic film (e.g., PDMS film) by fluid pressure so as to open or close a valve.

The polysiloxane, for example, a polysiloxane film, may be substantially bonded to the whole first surface and/or the third surface. The polysiloxane may be a film in a simple form on which a microstructure is not formed. Also, as another detailed example, polysiloxane may include a microstructure that may be formed in a whole or part of a channel, a chamber, or a valve, for example, a recess and a protrusion. The polysiloxane, for example, a polysiloxane film, may be bonded via a part of a surface between the first surface and/or the third surface.

The method may further include providing an opposite surface of a second surface of the polysiloxane provided with oxygen plasma, or providing a first surface of a second polysiloxane with oxygen plasma, or providing both the opposite surface of the second surface of the polysiloxane provided with oxygen plasma and the first surface of the second polysiloxane with oxygen plasma; and by contacting the first surface of the second polysiloxane with the opposite surface of the second surface of the polysiloxane, bonding the first surface of the second polysiloxane to the opposite surface of the second surface of polysiloxane. The second surface of the polysiloxane may have a microstructure therein.

The bonding product may be a microfluidic device. The microfluidic device may refer to a device including at least one microstructure. Description of the "microstructure" is the same as described above. The microfluidic device may be a microfluidic device connecting an inlet and an outlet thereof with at least one channel. The microfluidic device may further include an additional structure such as a valve, a pump, and a chamber.

In a microfluidic device, a first plastic material substrate including a first surface may include a surface on which a fluid channel is formed, a second plastic material substrate including a third surface may include a surface on which a pneumatic channel is formed, and a polysiloxane, for example, a polysiloxane film, may be disposed between the first surface of the first plastic material substrate and the third surface of the second plastic material substrate so that when pressure or vacuum is applied to the pneumatic channel, the film is deflected to adjust a fluid flow in the fluid channel. The film may generally block fluid flow in the fluid channel and when pressure or vacuum is applied to the pneumatic channel, the film may be deflected such that the fluid in the fluid channel may flow. The microfluidic construct may include an additional surface and an additional film. The additional surface may be an additional channel to provide a path for fluid flow. The first plastic material substrate may include a plurality of bias channels to provide a path for fluid flow. The microfluidic construct may include a plurality of valves embodied by using the film, which is disposed as a part of a pump.

In the method, one or more processes of the method, for example, all processes, may be performed in a surrounding atmosphere or in a dry state, not in a liquid such as water.

In the method, a surface of a plastic material may not be coated with silicon oxide (SiO2). In this regard, the method may not include forming a silicon oxide layer on the surface of the plastic material.

The method may not include coating a primer composition on a surface and exposing the surface to the primer composition in order to improve an adhesion between a plastic material-polysiloxane and a polysiloxane-plastic material for a structure of plastic material-polysiloxane-plastic material.

According to an aspect of another exemplary embodiment, provided is a construct in which a plastic material and polysiloxane that are prepared by the method are bonded. The plastic material, a polysiloxane, or a combination thereof may have a microstructure formed therein.

According to an aspect of another exemplary embodiment, provided is a microfluidic device including the construct. In the microfluidic device, a polysiloxane is in a film form, and a second surface provided with oxygen plasma of the polysiloxane may be bonded with a first surface of the plastic material provided with nitrogen or ammonia plasma. Also, the microfluidic device may further include a third surface of a second plastic material provided with nitrogen or ammonia plasma that is bonded with an opposition surface of a second surface of polysiloxane provided with oxygen plasma. Also, the microfluidic device may further include a first surface of a second polysiloxane that is bonded with the opposition surface of the second surface of polysiloxane provided with oxygen plasma.

The microfluidic device may include a first plastic material substrate having a first surface; a second plastic material substrate having a third surface; and a polysiloxane layer disposed between the first substrate and the second substrate, wherein a second surface of the polysiloxane layer, which is provided with oxygen plasma, is bonded to the first surface, where the polysiloxane contacted, of the first plastic material substrate provided with nitrogen or ammonia plasma, and an opposite surface of the second surface provided with oxygen plasma is bonded to a third surface, where the polysiloxane contacted, of the second plastic material substrate.

The microfluidic device may include a first plastic material substrate having a first surface; a second polysiloxane substrate having a third surface; and a polysiloxane layer disposed between the first substrate and the second polysiloxane substrate, wherein a second surface provided with oxygen plasma, of the polysiloxane layer is bonded to the first surface, where the polysiloxane layer contacted, of the first plastic material substrate provided with nitrogen or ammonia plasma; an opposite surface of the second surface is bonded to the third surface of the second polysiloxane substrate; and the opposite surface of the second surface, the third surface of the second polysiloxane substrate, or a combination thereof is provided with oxygen plasma.

By the method of bonding two surfaces according to an aspect, the two surfaces may be efficiently bonded to each other. Also, the bonding product may have excellent resistance to hydrolysis. In addition, a plastic material surface may be efficiently bonded for manufacturing, and thus, it is easy and convenient to manufacture various structures with low cost.

A construct according to another aspect and a microfluidic device including the construct may have excellent resistance to hydrolysis.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. As used herein, the term "and/or" includes any and all combinations of one or more of the associated listed items.

EXAMPLE 1

(1) Contact of Polystyrene Substrate with Polysiloxane

In detail, a polystyrene substrate (square, 5 cm×9 cm, thickness of 0.2 cm) was placed on a support, and polydimethylsiloxane (PDMS) (square, 5 cm×9 cm, thickness of 250 cm: Rogers Co., HT-6240 model) as a polysiloxane was placed on a first surface of the polystyrene substrate. Then, 50 Pa of pressure was applied at room temperature for 1 minute. Time of flight secondary ion mass spectrometry (TOF-SIMS) was performed on the obtained surface of the polystyrene substrate where PDMS contacted to analyze element components thereof by using a TOF-SIMS 4model (ION-TOF Co.). An acceleration voltage was 25 kev Bi, a current was 1 pA, and a measured area was 200 um×200 um. As a control group, a polystyrene substrate that does not contact PDMS and has the same size and shape as the polystyrene substrate where PDMS contacted.

Figure 1:
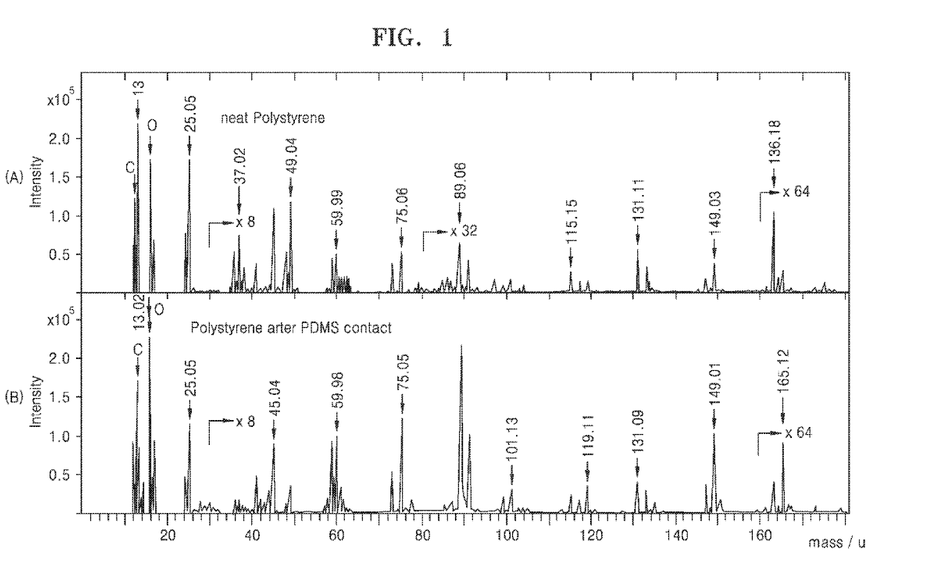
FIG. 1 illustrates a time of flight secondary on mass spectroscopy (TOF-SIMS) analysis graph for a polystyrene substrate without contact with a polydimethylsiloxane (PDMS) (panel A) and after contact with a PDMS material (panel B)

FIG. 1 illustrates a TOF-SIMS analysis graph about a polystyrene substrate where PDMS contacted.

In FIG. 1, panel (A) illustrates the control group in which a polystyrene substrate does not contact PDMS and has the same size and shape as the polystyrene substrate where PDMS contacted, and panel (B) illustrates an experimental group in which a polystyrene substrate contacts PDMS. In FIGS. 1, C and O denote peaks of carbon (C) and oxygen (O). The terms ×8, ×32, and ×64 denote a magnification ratio. Marks of peak magnification were automatically drawn in a graph at masses of 30, 80, and 160, and denote the difference in intensity. The horizontal axis shows molecular weight in units of mass/u, and the vertical axis shows intensity in arbitrary units.

Figure 2:
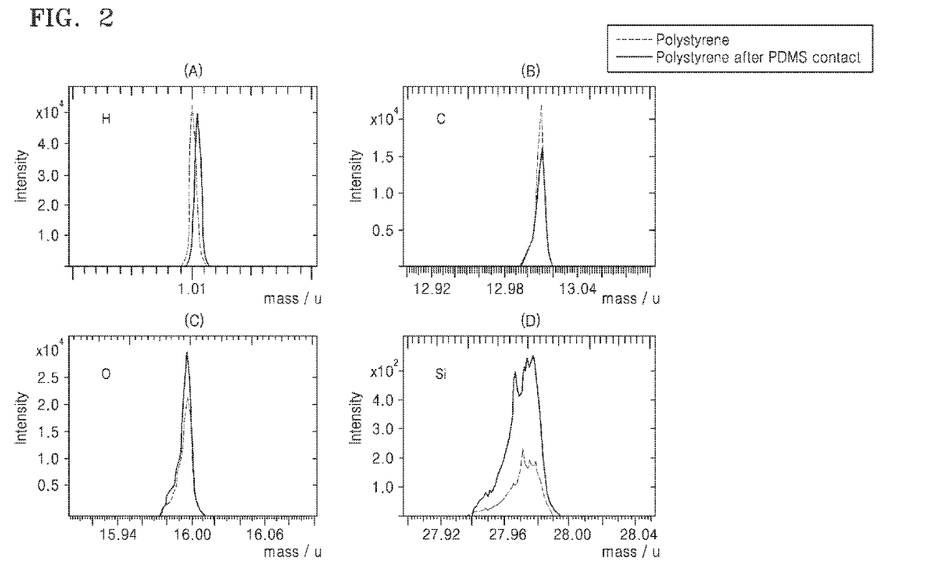
FIG. 2 illustrates signals corresponding to H, C, O, and Si from FIG. 1, showing that the signals of the experimental group and the control group overlap each other.

FIG. 2 illustrates that signals of an experimental group and a control group, which respectively correspond to H, C, O, and Si in FIG. 1, overlap with each other. In FIG. 2, panels A, B, C, and D illustrate signals of H, C, O, and Si, respectively. FIG. 2 is a magnification of part of FIG. 1 showing significant differences in the SIMS results of FIG. 1.

As illustrated in FIGS. 1 and 2, the amount of oxygen (50%) and silicon (200%) in the experimental group was increased in comparison with the control group. These results indicate that siloxane moieties of the PDMS are transferred to the polystyrene substrate by contacting the polystyrene substrate with PDMS.

Also, Fourier transform infrared spectroscopy (FTIR) was performed on the control group and the experimental group of the polystyrene substrate by using a Varian 670-IR (Varian Co.) to analyze a light absorption signal.

Figure 3:
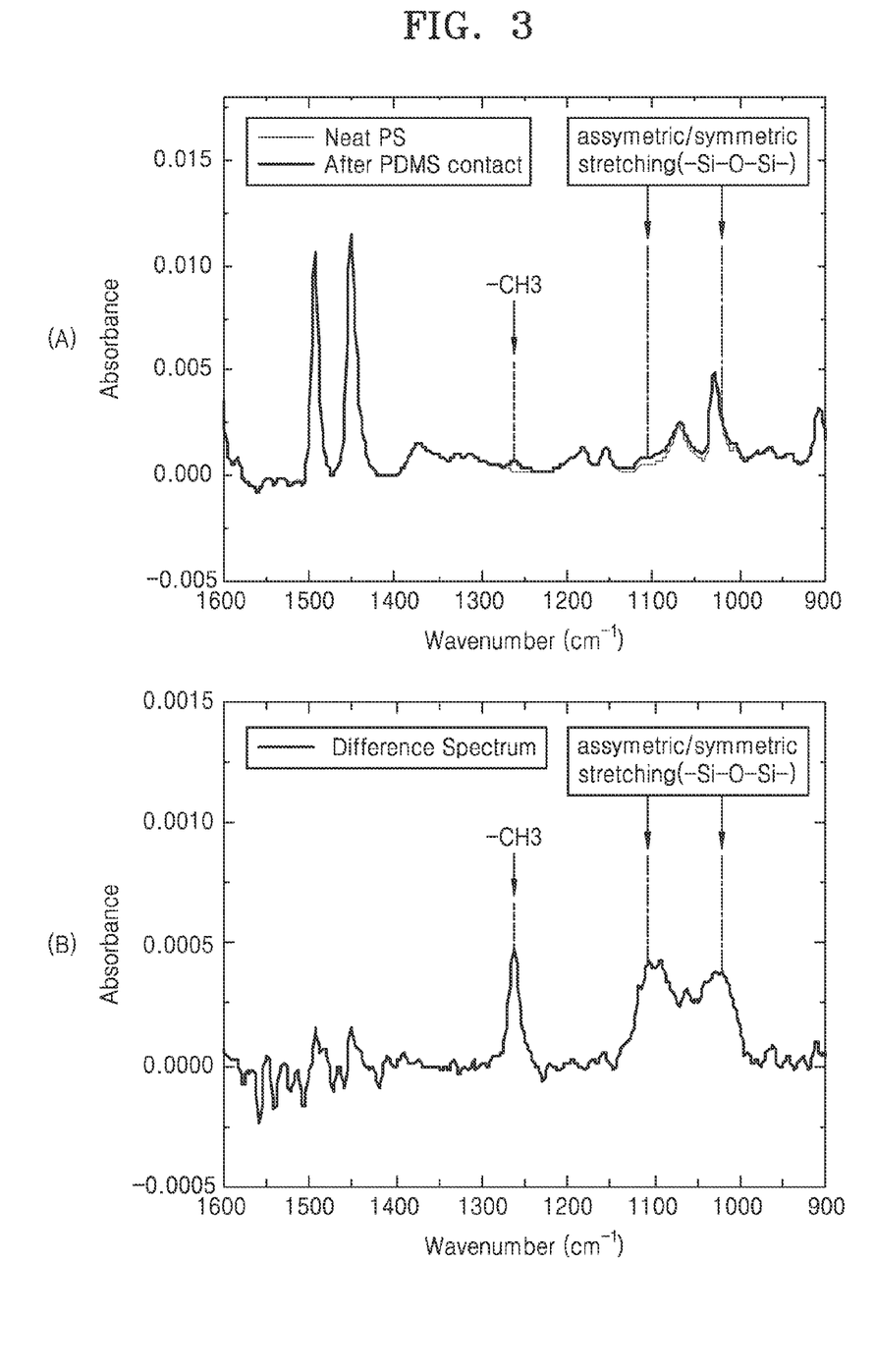
FIG. 3 is an FTIR analysis graph of the polystyrene substrate contacted with PDMS and polystyrene alone (panel A), and difference between the polystyrene substrate contacted with PDMS and the polystyrene alone (panel B)

FIG. 3 illustrates an FTIR analysis graph of the polystyrene substrate where PDMS was contacted and the polystyrene alone (panel A) and difference between the polystyrene substrate contacted with PDMS and the polystyrene alone (panel B). Panel B is a spectrum difference which is obtained by extracting spectrum of "Neat PS" from that of "After PDMS contact". As illustrated in panel B of FIG. 3, —CH3 and —Si—O—Si— moieties of the polystyrene substrate in the experimental group were increased in comparison with those in the control group, that is, a polystyrene that was not contacted with PDMS. In particular, —CH3 moiety of the polystyrene substrate supposed to be derived from PDMS was significantly increased, which means that polysiloxane having a small molecular weight, rather than polysiloxane having a high molecular weight, was transferred to the polystyrene surface, but the claimed scope of the invention is not limited to a specific mechanism. This means that, by the contact, a siloxane moiety of PDMS was delivered and attached to a polystyrene substrate. In FIG. 3, —CH3 and arrows respectively indicate a frequency corresponding to —CH3 and frequencies corresponding to asymmetric and symmetric stretching of —Si—O—Si—.

Figure 4:
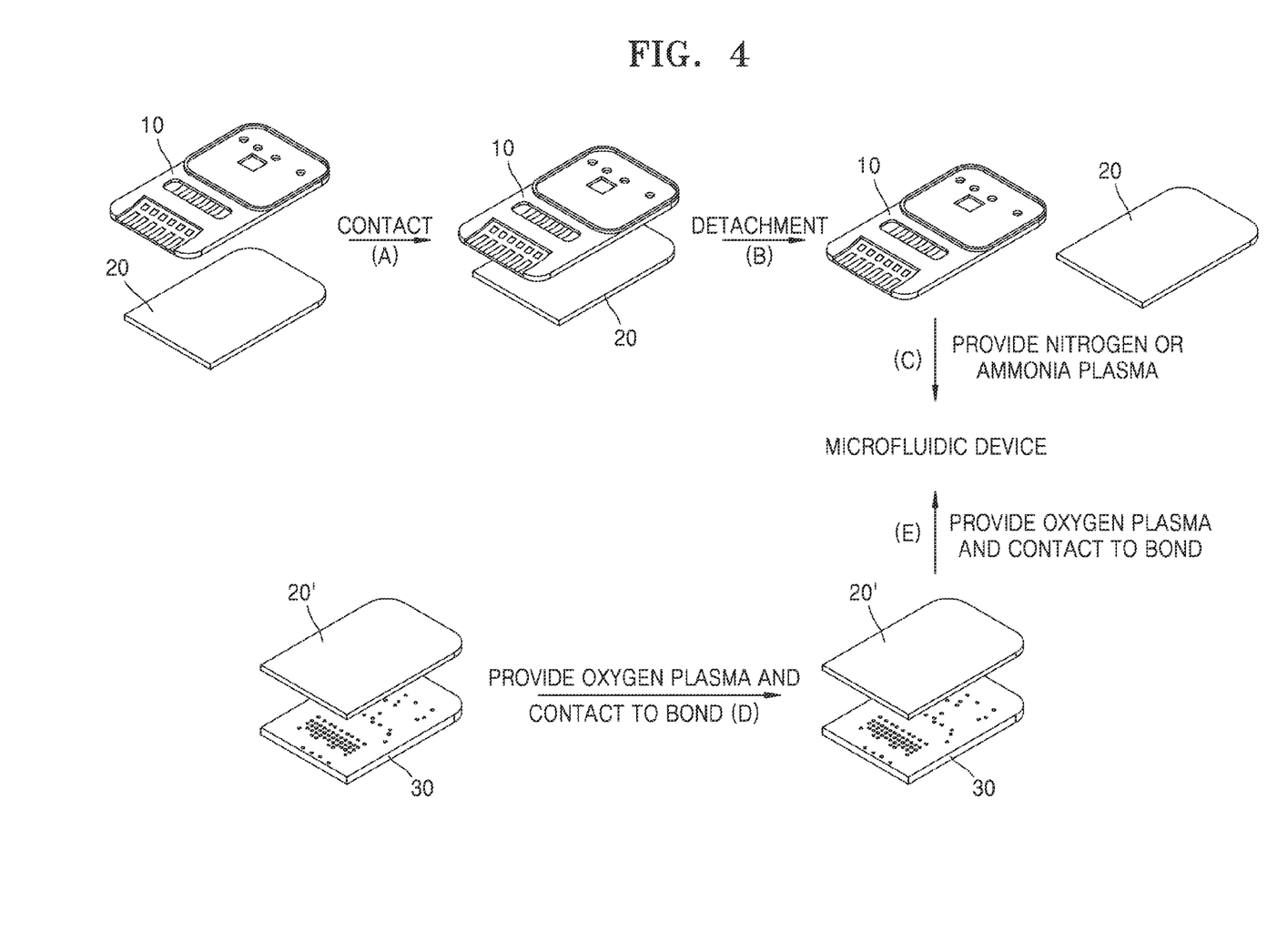
FIG. 4 illustrates an example of manufacturing a microfluidic device as described herein.

(2) Manufacturing a Microfluidic Device by Directly Bonding a Polystyrene Substrate where Polysiloxane Contacted and Polysiloxane (2.1) Manufacturing a Microfluidic Device A microfluidic device was manufactured by using a polystyrene substrate where the polysiloxane contacted and a polysiloxane film. FIG. 4 illustrates an example of manufacturing a microfluidic device by using a polystyrene substrate where the polysiloxane contacted and a polysiloxane film.

A manufacturing method of a microfluidic device, by referring to FIG. 4, is as follows: First, a fluidic layer 10 was made from polystyrene, including a channel through which fluid may flow. A first surface of the fluidic layer 10 was contacted with a surface of a PDMS film 20, which is a polysiloxane (A). In this case, the contact therebetween may be performed at room temperature and pressure of 50 kPa or less. Next, the PDMS film 20 was peeled off from the fluidic layer 10 after the contact therebetween (B). Then, nitrogen or ammonia plasma was provided to the first surface of the fluidic layer 10, where the PDMS film 20 contacted (C). The nitrogen or ammonia plasma was provided at plasma power of about 30 W to about 50 W, at a gas flow rate of about 1 sccm to about 5 sccm, and for about 20 seconds to about 60 seconds. As a result, the fluidic layer 10 provided with nitrogen or ammonia plasma was manufactured.

Meanwhile, a pneumatic layer 30 made of PDMS and having a pneumatic channel was contacted with a surface of a PDMS film 20' treated with oxygen plasma, and the oxygen plasma-treated surface of PDMS film 20' and the pneumatic layer 30 were bonded to each other. As a result, the pneumatic layer 30, to which the PDMS film 20' was bonded, was manufactured (D). The oxygen plasma was provided at plasma power of about 70 W to about 100 W, at gas flow rate of about 30 sccm to about 50 sccm, and for an exposure time of about 60 seconds to about 180 seconds.

Then, oxygen plasma was provided to the opposite surface of the PDMS film 20' (i.e., the surface of the PDMS film opposite that bonded to the pneumatic layer 30(E). Here, oxygen plasma was provided at plasma power of about 70 W to about 100 W, a gas flow rate of about 30 sccm to about 50 sccm, and for an exposure time of about 60 seconds to about 180 seconds. The oxygen plasma-treated surface of the PDMS film 20' of the pneumatic layer 30 was then contacted and bonded to the first surface of the fluidic layer that was treated with nitrogen or ammonia plasma (E). As a result, a microfluidic device, in which the fluidic layer 10 and the pneumatic layer 30 were bonded to each other via the PDMS film 20', was manufactured. The microfluidic device may be a microscale on-chip valves (MOVe) device.

A method of manufacturing a microfluidic device may be also performed by changing some processes illustrated in FIG. 4. For example, two types of PDMS films 20 and 20' are illustrated in FIG. 4, and the PDMS film 20 contacted the fluidic layer 10 and was used only to deliver a siloxane moiety. However, the same PDMS film 20 that was used to deliver a siloxane moiety to the fluidic layer 10 can be bonded to the pneumatic layer 30 Also, any order of steps can be used that provides the same result.

One or more processes illustrated in FIG. 4, for example, all processes may be performed in an atmosphere or in a dry state.

Figure 5:
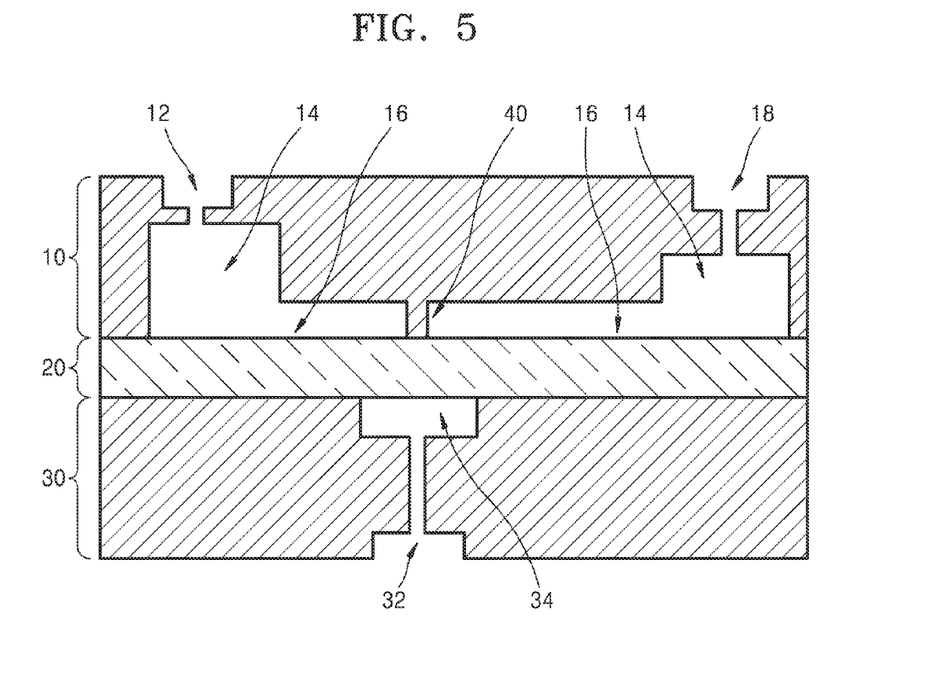
FIG. 5 illustrates an example of a microfluidic device manufactured in FIG. 4.

FIG. 5 illustrates an example of a microfluidic device manufactured in FIG. 4. As illustrated in FIG. 5, a microfluidic device includes the fluidic layer 10, the pneumatic layer 30, and the PDMS film 20 to which the fluidic layer 10 and the pneumatic layer 30 are bonded, and by which the fluidic layer 10 and pneumatic layer 30 are joined to each other. The fluidic layer 10 is a plastic material (e.g., polystyrene), and the pneumatic layer 30 is polysiloxane (e.g., PDMS), and the PDMS film 20 is a polysiloxane film. The fluidic layer 10 includes a microstructure. The microstructure includes a fluidic inlet port 12, a fluidic chamber 14, a fluidic channel 16, a valve seat 40, and a fluidic outlet port 18. When the valve seat 40 contacts the PDMS film 20, the fluidic channel 16 may be closed and when the valve seat 40 is separated from the PDMS film 20, the fluidic channel 16 may be open. In this regard, the valve seat 40 may serve as a valve. The pneumatic layer 30 includes a pneumatic port 32 and a pneumatic channel 34. By applying positive or negative pressure to the pneumatic port 32, the PDMS film 20 may contact or be separated from the valve seat 40 to close or open the fluidic channel 16. As a detailed example, the PDMS film 20 may have a thickness of 250 um, the fluidic layer 10 may have a thickness of 2 mm, and the pneumatic layer 30 may have a thickness of 2 mm.

Figure 6:
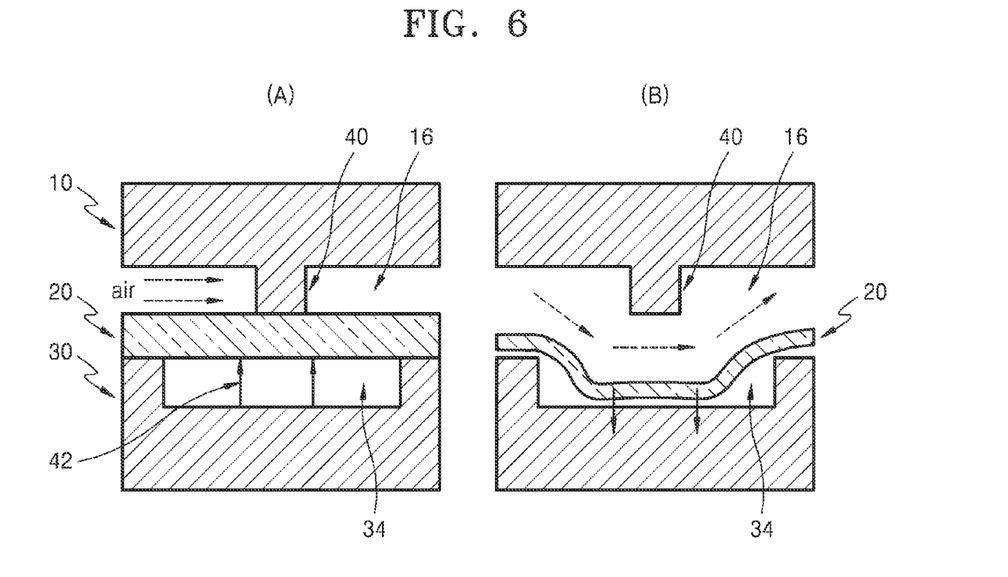
FIG. 6 is a view in which a valve seat in FIG. 5 is enlarged to show a state of the valve seat when a fluidic channel is closed (panel A) and open (panel B).

FIG. 6 is a view in which the valve seat 40 in FIG. 5 is enlarged to show a state of the valve seat 40 when the fluidic channel 16 is in closed state (FIG. 6A) and is in open state (FIG. 6B). As illustrated in FIG. 6, when a pneumatic pressure in the fluidic channel 16 is high or a negative pressure in the pneumatic channel 34 is strong, the PDMS film 20 is separated from the valve seat 40 to open the fluidic channel 16.

(2.2) Measurement of Adhesion Strength of Manufactured Microfluidic Device

For a microfluidic device manufactured in (2.1), as illustrated in FIG. 5, an adhesion strength between the PDMS film 20 and the fluidic layer 10 was measured by loading a 1N NaOH into the fluidic inlet port 12 at a pressure of about 1 kPa to about 300 kPa and measuring a leak of the 1N NaOH solution over time. The leak was detected by a charge-coupled device (CCD) camera. Based on a leakage time period and amount, the adhesion strength between the PDMS film 20 and the fluidic layer 10 may be measured. The microfluidic device includes a PDMS film (5 cm×9 cm) having a thickness of 250 um; the pneumatic layer 30 made of PDMS and having the pneumatic channel 34 with a diameter of 500 um; and the fluidic layer 10 made of polystyrene and having the fluidic channel 16 with a diameter of 200 um.

Table 1 shows an adhesion strength between a polystyrene surface and a PDMS film when the polystyrene surface was treated with plasma without first contacting the untreated PDMS film with the polystyrene surface.

TABLE 1

|      |                | polystyrene       |                   |
|------|----------------|-------------------|-------------------|
|      |                | oxygen plasma     | nitrogen plasma   |
| PDMS | oxygen plasma  | <1 kPa, 10 sec    | <6 kPa, 1 min     |
|      | nitrogen plasma| <1 kPa, 10 sec    | <2 kPa, 20 sec    |

The pressure and time shown in Table 1 refers to minimum pressure and time at which a leak started when a CCD camera detects a leak of a 1N NaOH solution by increasing pressure from about 1 kPa every 10 seconds. When a leak is detected by the CCD camera, a leak may be detected without a dye. When providing the polystyrene surface with nitrogen plasma, and providing the PDMS film with oxygen plasma, the result of the adhesion strength between the polystyrene surface and the PDMS film was <6 kPa, 1 min, which was the strongest.

Table 2 shows an adhesion strength between a polystyrene surface and a PDMS film when the polystyrene surface is first contacted the PDMS film and then treated with plasma.

TABLE 2

|      |                 | polystyrene where PDMS film contacted |                 |
|------|-----------------|---------------------------------------|-----------------|
|      |                 | oxygen plasma                         | nitrogen plasma |
| PDMS | oxygen plasma   | <2 kPa, 20 sec                        | >300 kPa, 1 hr* |
|      | nitrogen plasma | <2 kPa, 20 sec                        | <3 kPa, 30 sec  |

As shown in Table 2, when bonding a polystyrene surface by first contacting the polystyrene surface with the PDMS, then treating the polystyrene with nitrogen plasma and treating the PDMS film with oxygen plasma, the result was >300 kPa, 1 hr, which adhesion strength was far greater than the comparative examples.

In addition, when SiO2 is provided to a polystyrene surface by sputtering, and then oxygen plasma is provided to a surface of a PDMS film, and oxygen plasma is further provided to the polystyrene surface provided with SiO2 to bond the polystyrene surface provided with SiO2 to the PDMS film provided with oxygen plasma, the result shows an adhesion strength of >300 kPa, 1 hr.

As shown in Tables 1 and 2, by contacting a plastic material surface with PDMS and removing the PDMS, siloxane may be delivered and attached to the plastic material surface. By then treating the plastic surface with nitrogen plasma and then bonding an oxygen plasma-treated PDMS to the plastic surface, an adhesion strength between the plastic material surface and the PDMS is significantly improved.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of bonding two surfaces, the method comprising:
    contacting a surface of a plastic material with a polysiloxane material;
    removing the polysiloxane material from the surface of the plastic material;
    providing nitrogen or ammonia plasma to the surface of the plastic material that was contacted with the polysiloxane material;
    providing oxygen plasma to a surface of a polysiloxane material; and
    contacting the surface of the plastic material provided with nitrogen or ammonia plasma with the surface of the polysiloxane material provided with oxygen plasma to bond the surfaces together and provide a bonded product, wherein the bonded product is a microfluidic device.

2. The method of claim 1, wherein
contacting the surface of the plastic material with the polysiloxane material before providing nitrogen or ammonia plasma to the surface of the plastic material comprises applying pressure between the surface of the plastic material and the polysiloxane material of at least 1 Pa.

3. The method of claim 1, wherein the polysiloxane material contacted with the surface of the plastic material before providing nitrogen or ammonia plasma to the surface of the plastic material is in a solid state.

4. The method of claim 1, wherein the polysiloxane material contacted with the surface of the plastic material before providing nitrogen or ammonia plasma to the surface of the plastic material is a polysiloxane film.

5. The method of claim 1, wherein providing nitrogen or ammonia plasma to the surface of the plastic material comprises exposing the surface of the plastic material to nitrogen or ammonia plasma at a plasma power of about 30 W to about 50 W and a gas flow rate of about 1 sccm to about 5 sccm for about 20 seconds to about 60 seconds.

6. The method of claim 1, wherein providing oxygen plasma to the surface of the polysiloxane material comprises exposing the second surface to oxygen plasma at a plasma power of about 70 W to about 100 W and a gas flow rate of about 30 sccm to about 50 sccm for about 60 seconds to about 180 seconds.

7. The method of claim 1, wherein contacting the surface of the plastic material provided with nitrogen or ammonia plasma with the surface of the polysiloxane material provided with oxygen plasma comprises applying pressure between the surfaces of at least 1 Pa.

8. The method of claim 1, wherein the plastic material is a carbon-based polymer.

9. The method of claim 1, wherein the plastic material is polyolefin, polystyrene, polycarbonate (PC), polymethacrylate (PMA), poly(methyl methacrylate) (PMMA), polytetrafluoroethylene (PTFE), polyvinylidene chloride (PVC), polyethylene terephthalate (PET), or a combination thereof.

10. The method of claim 1, wherein the polysiloxane material contacted with the surface of the plastic material before providing nitrogen or ammonia plasma to the surface of the plastic material, and the polysiloxane material provided with oxygen plasma, which may be the same or different, are each independently a material comprising a polysiloxane of Formula 1, (Formula 1)

wherein,
$R_1$, $R_2$, and $R_3$ are each independently hydrogen, an alkyl group, an aryl group, a cycloalkyl group, an alkoxy group, a hydroxyalkyl, an alkoxyalkyl group, and a hydroxyalkoxyalkyl group, each optionally substituted with a halo group,
$R_4$ is hydrogen, an alkyl group or an aryl group, each optionally substituted with a halo group,
and n is an integer.

11. The method of claim 1, wherein
the polysiloxane material contacted with the surface of the plastic material before providing nitrogen or ammonia plasma to the surface of the plastic material and the polysiloxane material provided with oxygen plasma, which may be the same or different, are each independently polydimethylsiloxane (PDMS) or polyphenylsiloxane.

12. The method of claim 1, further comprising performing an annealing process after bonding the surfaces.

13. The method of claim 1, wherein the plastic material comprises a microstructure.

14. The method of claim 1, further comprising
providing oxygen plasma to a surface of the polysiloxane material opposite the surface contacted with the plastic material; and
contacting a surface of a second polysiloxane with the surface of the polysiloxane material opposite the surface contacted with the plastic material, to bond the surface of the second polysiloxane to the surface of the polysiloxane material opposite the surface contacted with the plastic material.

15. The method of claim 1, further comprising
providing oxygen plasma to a surface of a second polysiloxane material, and contacting the surface of the second polysiloxane material with a surface of the polysiloxane material opposite the surface contacted with the plastic material, to bond the surface of the second polysiloxane to the surface of the polysiloxane material opposite the surface contacted with the plastic material.

16. The method of claim 1, further comprising
providing oxygen plasma to a surface of the polysiloxane material opposite the surface contacted with the plastic material and a surface of a second polysiloxane; and
contacting the surface of the second polysiloxane with the surface of the polysiloxane material opposite the surface contacted with the plastic material, to bond the surface of the second polysiloxane to the surface of the polysiloxane material opposite the surface contacted with the plastic material.

17. The method of claim 16, wherein the second polysiloxane comprises a microstructure.

* * * * *